(12) United States Patent
Amano

(10) Patent No.: US 7,100,240 B2
(45) Date of Patent: Sep. 5, 2006

(54) HINGE DEVICE HAVING TEMPORARY ANGLE SET FUNCTION

(75) Inventor: Masayuki Amano, Yokohama (JP)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 11/167,985

(22) Filed: Jun. 27, 2005

(65) Prior Publication Data

US 2005/0235459 A1 Oct. 27, 2005

Related U.S. Application Data

(63) Continuation of application No. PCT/JP2003/16827, filed on Dec. 25, 2003.

(30) Foreign Application Priority Data

Dec. 25, 2002 (JP) .............................. 2002-374917

(51) Int. Cl.
*E05F 1/08* (2006.01)
(52) U.S. Cl. .............................. 16/303; 16/330; 16/284
(58) Field of Classification Search .................. 16/303, 16/330, 284, 297, 300, 312, 319, 324, 332, 16/363; 455/575.1, 575.3; 379/433.13, 379/434; 361/683, 803
See application file for complete search history.

(56) References Cited

U.S. PATENT DOCUMENTS

| 5,923,751 | A * | 7/1999 | Ohtsuka et al. ......... 379/433.13 |
| 6,175,990 | B1 | 1/2001 | Kato et al. |
| 6,305,050 | B1 * | 10/2001 | Imai .............................. 16/303 |
| 6,618,903 | B1 * | 9/2003 | Kim .............................. 16/337 |
| 2004/0025298 | A1 * | 2/2004 | Yang et al. .................... 16/340 |
| 2004/0093690 | A1 * | 5/2004 | Lu et al. ......................... 16/330 |
| 2005/0050683 | A1 * | 3/2005 | Tonogai ......................... 16/305 |

FOREIGN PATENT DOCUMENTS

JP 10-246222 A 9/1998

* cited by examiner

*Primary Examiner*—Chuck Y. Mah
*Assistant Examiner*—Mark T. Vogelbacker
(74) *Attorney, Agent, or Firm*—Cohen, Pontani, Lieberman & Pavane

(57) ABSTRACT

In order to facilitate the assembling of a hinge device, hinge-arm angle is temporarily allowed for free setting. Here, between an annular portion of hinge arm and a fixed cam, a stopper is provided which is to prevent against a fitting of between a recess of annular portion and a protrusion of fixed cam. During assembling of the hinge device to a display and main body, setting is made to prevent against a fitting. After assembled, the same is slid to allow for fitting of between them.

8 Claims, 7 Drawing Sheets

HINGE DEVICE HAVING TEMPORARY ANGLE SET FUNCTION

This application is a U.S. Continuation Application under 35 USC 371 of International Application PCT/JP2003/016827 filed 25 Dec. 2003.

BACKGROUND OF THE INVENTION

1. Field of the Invention

The present invention relates to hinge devices, and more particularly to a hinge device which temporarily allows for freely setting the hinge-arm angle to facilitate the assembling to a subject of hinge connection.

2. Description of the Related Art

There is a disclosed example of a hinge device having angle hold function, in JP-A-2002-374545 filed by the present applicant on the same day. FIG. 6 shows an exterior perspective view of this hinge device. In the hinge device 1, a hinge arm 11A, 11C can freely rotate to an angle of 0 to 154 degrees for example, relative to a hinge arm 11B, 11D. The angle can be held at 154 degrees and, furthermore, rotation is possible to an angle of exceeding 154 degrees and up to approximately 180 degrees. The hinge device 1 is usable for connection in an electronic appliance in various kinds, e.g. connection between a display 12 and a main body 13 of a cellular phone.

FIG. 7 shows an exterior perspective view of a cellular phone connecting between display 12 and main body 13 by the utilization of the hinge device. This figure shows particularly a use state, i.e. state of communication. Though not clear from the figure, the display 12 and the main body 13 of the cellular phone are respectively fixed to the hinge arms 11A, 11C and 11B, 11D shown in FIG. 6. Therefore, the display 12 and the main body 13 are to be rotated freely at least between 0 and 154 degrees by the action of hinge arm 1. The angle can be held at 154 degrees wherein rotation is possible to an angle of exceeding 154 degrees and up to approximately 180 degrees.

Referring to FIG. 6 and further FIGS. 8 and 9, brief explanation is made on the process of assembling the FIG. 6 hinge device to the display 12 and main body 13 into a FIG. 7 cellular phone. At first, an FPC 14 is wound around the FIG. 6 hinge device into a FIG. 8 state. Thereafter, a cover 16 is attached in a state exposing the hinge arms 11A–11D only, into a state as shown in FIG. 9. Then, in the state attaching the cover 16, the hinge arms 11A, 11C and 11B, 11D are set to a proper angle, to a possible extent, for assembling to display 12 and main body 13. Thereafter, fixing to the display 12 and to main body 13 is done by passing screws or so in holes 16 of fixing portions of the hinge arms 11A–11D. Furthermore, together with such operation, the ends of FPC 15 exposed out of the cover 16 are respectively fixed from above to predetermined positions of display 12 and main body 13. Finally, the display 12 and the main body 13 are closed in their lids into a completion.

In the above process, a problem arises in fixing the hinge arm 11 to the display 12 and main body 13. This is because the angle between hinge arms 11A, 11C and 11B, 11D can be held solely at 154 degrees as noted before. The angle of 154 degrees is considered not necessarily optimal for connecting the hinge arm 11 to the display 12 and main body 13. More specifically, where connecting the hinge device 1 to the display 12 and main body 13, the angle between hinge arms 11A, 11C and 11B, 11D can be preferably set/held at a proper angle of around 180 degrees in consideration of fixing of the hinge device 1 to the display 12 and main body 13 from above thereof. However, the angle between those can be held limitedly at 154 degrees, as nodded before. Accordingly, when assembling at least the hinge device 1 to the display 12 and main body 13, the angle between hinge arms 11A, 11C and 11B, 11D can be preferably set/held at around 180 degrees. On the other hand, once completing such assembling, such angle setting is desirably not to prevent the usual use.

However, the conventional hinge arm is previously determined with an angle between hinge arms, thus making it impossible to freely set/hold the angle between those.

The present invention has been made in order to solve such a problem in the prior art. It is an object to provide a hinge device that the hinge arms can be freely set/held to a proper angle of around 180 degrees for example, at least when assembling the hinge device to the main body or display, wherein such angle setting once such assembling is completed is not to prevent the usual use.

SUMMARY OF THE INVENTION

In order to achieve the foregoing object, the present invention is a hinge device having angle set function comprising: a shaft; a fixed part provided close to the shaft and not to rotate with rotation of the shaft; a first cam member having an engaging portion for engagement with a part of the fixed part, in a surface opposed to the fixed part, and an angle hold portion in an surface opposite thereto; a second cam member provided for rotating about the shaft with rotation of the shaft and for sliding over the shaft, and having an angle hold portion for holding, at a predetermined angle, an own rotation angle relative to the first cam member cooperatively with the angle hold portion of the first cam member; an elastic member for always biasing the second cam member toward the first cam member; a prevention member arranged between the fixed part and the first cam member and for preventing against engagement between a part of the fixed member and an engaging portion of the first cam member; a first arm for rotating with rotation of the shaft; and a second arm not for rotating with rotation of the shaft; whereby the first cam member is to rotate with rotation of the shaft when the prevention member prevents against an engagement of between a part of the fixed member and an engaging portion of the first cam member, the first cam member being not to rotate with rotation of the shaft when engagement is made between the part of the fixed member and the engaging portion of the first cam member.

In the hinge device, the fixed part may be a part of the first arm.

Meanwhile, in the hinge device, when the prevention member prevents against an engagement between the one part of the fixed part and the engaging portion of the first cam member, the first arm and the second arm are to be preferably set at an angle defined substantially of 180 degrees.

Meanwhile, the invention is a hinge device having angle set function comprising: a shaft; an annular portion provided close to one end of the shaft and having continuously a first recess in an own circumferential edge and a second recess deeper and shorter than the first recess, thus not allowed to rotate with rotation of the shaft; a fixed cam provided at least for temporarily rotating about the shaft and having a protrusion, for fitting in the second recess of the annular portion, in a surface opposed to the annular portion and an angle hold portion in an surface opposite thereto; a movable cam provided for rotating about the shaft with rotation of the shaft and for sliding over the shaft, and having an angle hold portion for engagement with the angle hold portion of the fixed cam and holding, at a predetermined angle, an own rotation angle to the fixed cam; a spacer provided close to the other end of the shaft; a spring provided between the spacer and the movable cam and always biasing the movable cam toward the fixed cam; a stopper member arranged between the annular portion and the fixed cam and for sliding over between the first recess and the second recess, and for covering over substantially an entire of the second recess and temporarily preventing the cam protrusion from fitting in the second recess; a first arm for rotating with rotation of the shaft; and a second arm not for rotating with rotation of the shaft; whereby the fixed cam is to rotate with rotation of the shaft through engagement with the movable cam in a state the protrusion of the fixed cam and the stopper member is kept in abutment when the stopper member temporarily prevents the protrusion of the fixed cam from fitting in the second recess, the fixed cam being not to rotate with rotation of the shaft due to a fitting between the protrusion of the fixed cam and the second recess of the annular portion when the stopper member is slid and removed out of the second recess.

In the hinge device, when the stopper member temporarily prevents the protrusion of the cam from fitting in the second recess, the fixed cam may be rotated a predetermined angle in a predetermined direction thereby releasing the abutment of the protrusion of the fixed cam and the stopper member into an abutment against the annular portion instead thereof, and subsequently the fixed cam be rotated in an opposite direction whereby the stopper member is allowed to slide by utilization of the protrusion of the fixed cam.

Meanwhile, in the hinge device, when the stopper member covers the second recess, the first arm and the second arm are to be preferably set at an angle defined substantially of 180 degrees.

Meanwhile, in the hinge device, a folding cellular phone may be formed by fixing a main body to a first arm of and a display to a second arm of a hinge device.

DESCRIPTION OF THE PREFERRED EMBODIMENT

Figure 1:
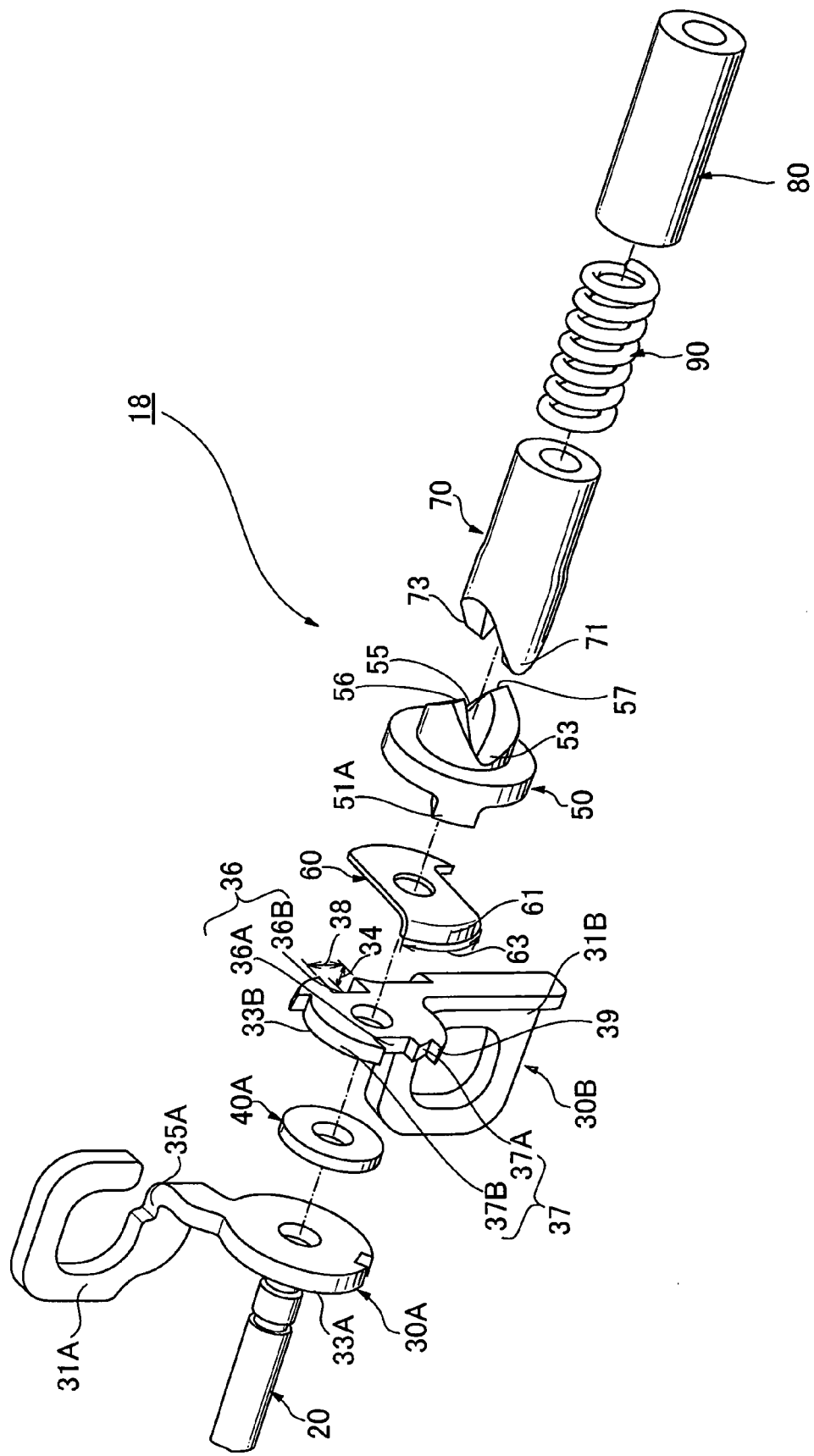
FIG. 1 is an exploded perspective view of a hinge device having angle set function according to the present invention.
Figure 2:
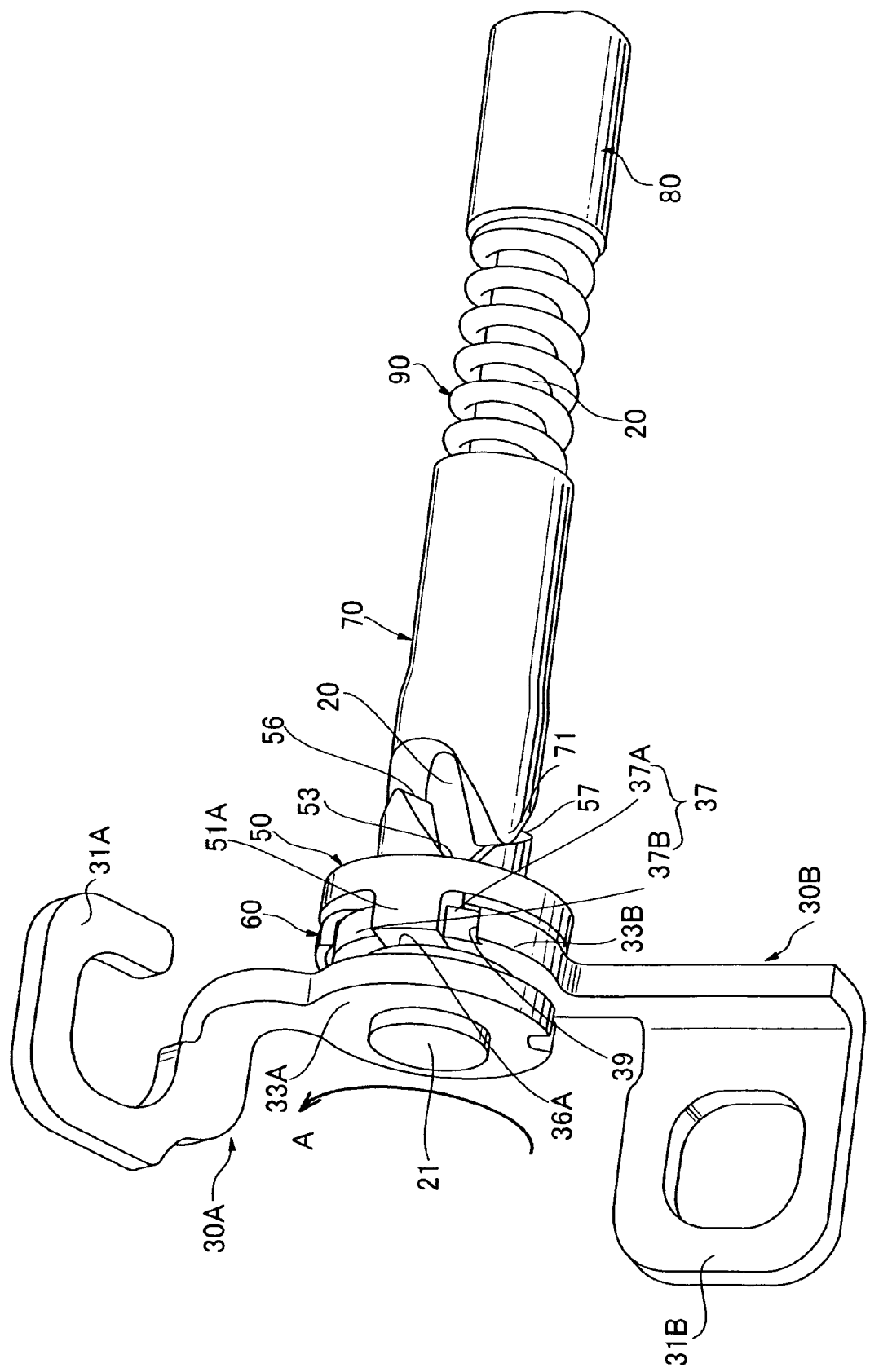
FIG. 2 is an assembly perspective view of the hinge device having angle set function according to the invention.

FIG. 1 shows an exploded perspective view of a hinge device having angle set function according to the present invention while FIG. 2 shows an assembly perspective view of the hinge device. Note that the members corresponding to the hinge arms C, D in FIG. 6 and the peripheral members thereof are omitted of showing in FIGS. 1 to 5 including those figures.

Incidentally, when referring to FIG. 2, it should be noted that FIG. 2 depicts a "state after the hinge device 18 has assembled to the display 12 and main body 13", not showing a "state the angle between the hinge arms is to be freely set during assembling the hinge device 18 to the display 12 and main body 13 (this state is favorably shown in FIG. 3, referred later)" the present invention is especially concerned with. More specifically, FIG. 2 shows a state the hinge device 18 is assembled with the display 12 and main body 13 through a state the angle between hinge arms 30A, 30C and hinge arms 30B, 30C is to be freely set in order to assemble the hinge device 18 to the display 12 and main body 13, i.e. the hinge device 18 placed in the usual use state (here, the angle between the hinge arms is somewhat smaller than 154 degrees). Accordingly, in the state of FIG. 2, the hinge arms 30A, 30C and the hinge arms 30B, 30D are allowed to define an angle solely of 154 degrees previously determined. As apparent from the following explanation, once such a state is attained, it may be considered usually impossible to freely set the angle between hinge arms 30A, 30C and hinge arms 30B, 30D again to the angle of upon assembling the hinge device 18 to the display 12 and main body 13, i.e. at around 180 degrees.

Figure 6:
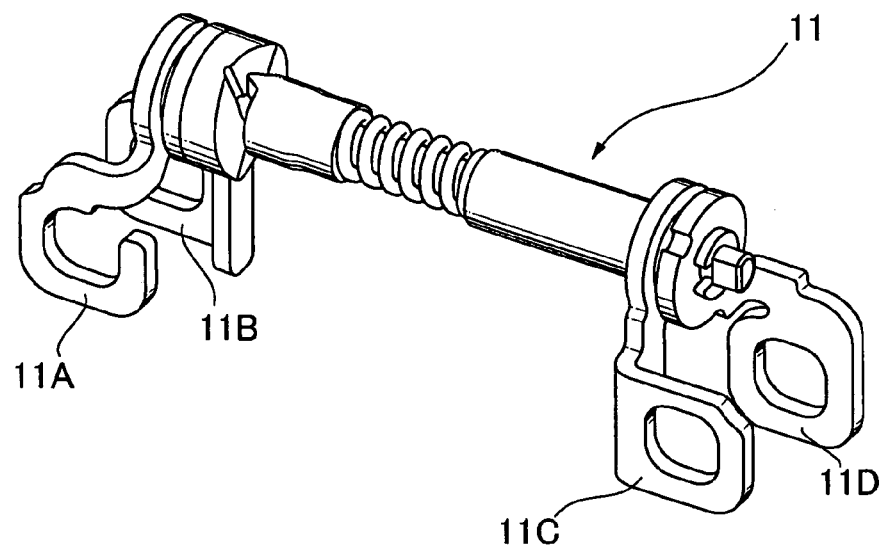
FIG. 6 is an exterior perspective view of a hinge device in the prior art.

As clear from FIGS. 1 and 2 (and 6), the hinge device 18 of the invention includes a shaft 20, hinge arms 30A, 30B arranged close to one end of the shaft 20, hinge arms 30C, 30D arranged close to the other end of the shaft 20 (not shown but may be considered corresponding to those 11C, 11D in FIG. 6), washers 40A, 40B provided between those hinge arms 30A, 30B and hinge arms 30C, 30D (washer 40B not shown but would be easily inferred), an annular cam (fixed cam) 50 provided on the side close to the hinge arms 30A, 30B, a stopper plate 60 provided between the cam 50 and the hinge arm 30A, a cylindrical cam follower (movable cam) 70 for rotation responsive to action of the cam 50, a cylindrical spacer 80 arranged close to the other end of the shaft 20, a spring 90 provided between the spacer 80 and the cam follower 70 and always biasing the cam follower 70 toward the cam 50.

Though not clear from the figures, of among these members the hinge arms 30A, 30C are fixed directly (or indirectly) with the shaft 20. Accordingly, the hinge arms 30A, 30C are allowed to rotate with a rotation of the shaft 20. The cam follower 70, although not fixed on the shaft 20, is provided to rotate about the shaft 20 as the shaft 20 rotates and to slide over the shaft 20. Contrary to this, the hinge arm 30B basically is fixed directly (indirectly) with the cam 50, but only after assembly of the hinge device is completed. Namely, the hinge arm 30B and the cam 50 are directly (or indirectly) fixed together as shown in FIG. 2 after completing the assembling of the hinge device 18 to the display 12 and main body 13. Conversely, during (before) assembling the hinge device 18 to the display 12 and main body 13, the hinge arm 30B is not fixed to the cam 50. This point would become apparent from the following explanations. Incidentally, the hinge arm 30B is merely fixed to the cam 50 without fixed to the shaft 20 and cam follower 70. Accordingly, even when the shaft 20 rotates, the hinge arm 30B does not rotate. Incidentally, because the hinge arm 30D is to rotate in unison with the hinge arm 30B as clear from FIG. 6, it does not rotate even if the shaft 20 rotates. The stopper plate 60 basically is not to rotate despite temporarily to rotate with a rotation of the shaft 20. This point is important in the invention, which will be described later. As for the other members, i.e. spring 90 and spacer 80, it is not concerned here whether or not those are to rotate with a rotation of the shaft 20. However, it may be generally considered that those are not to rotate with a rotation of the shaft 20 similarly to the hinge arms 30B, 30D, etc.

Figure 7:
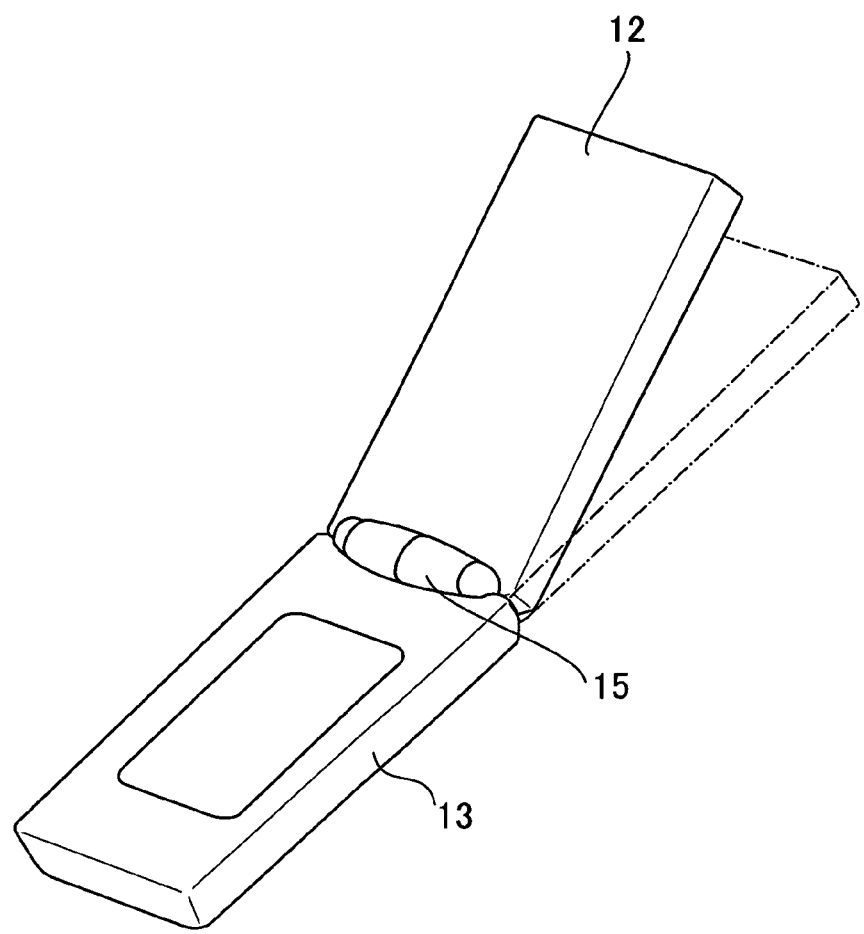
FIG. 7 is an exterior perspective view of a cellular phone that the main body and display are connected together by utilization of the hinge device.
Figure 8:
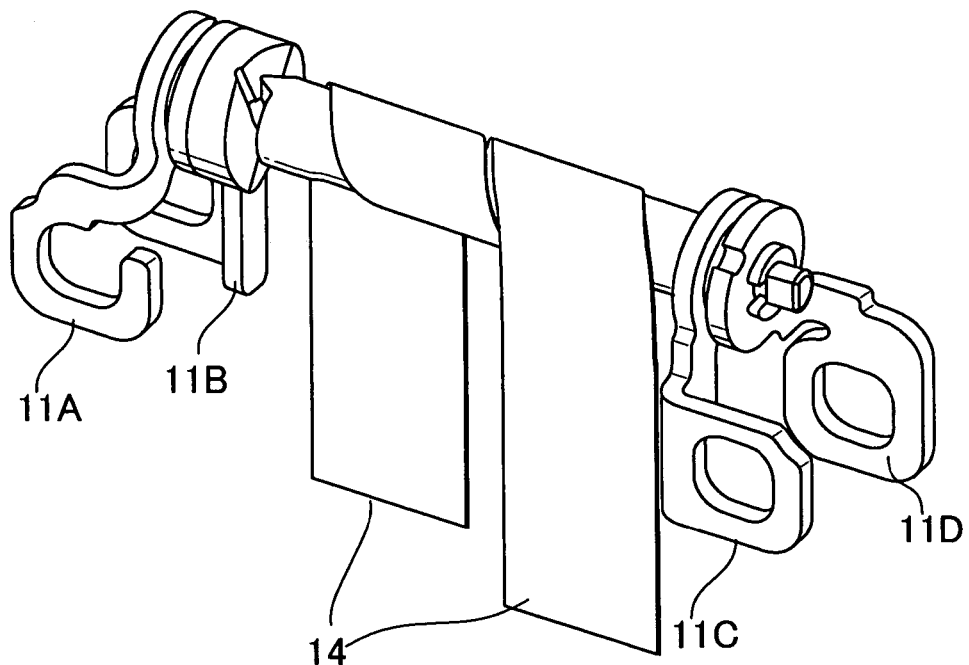
FIG. 8 is a view explaining the process of assembling the main body and display to the hinge device.
Figure 9:
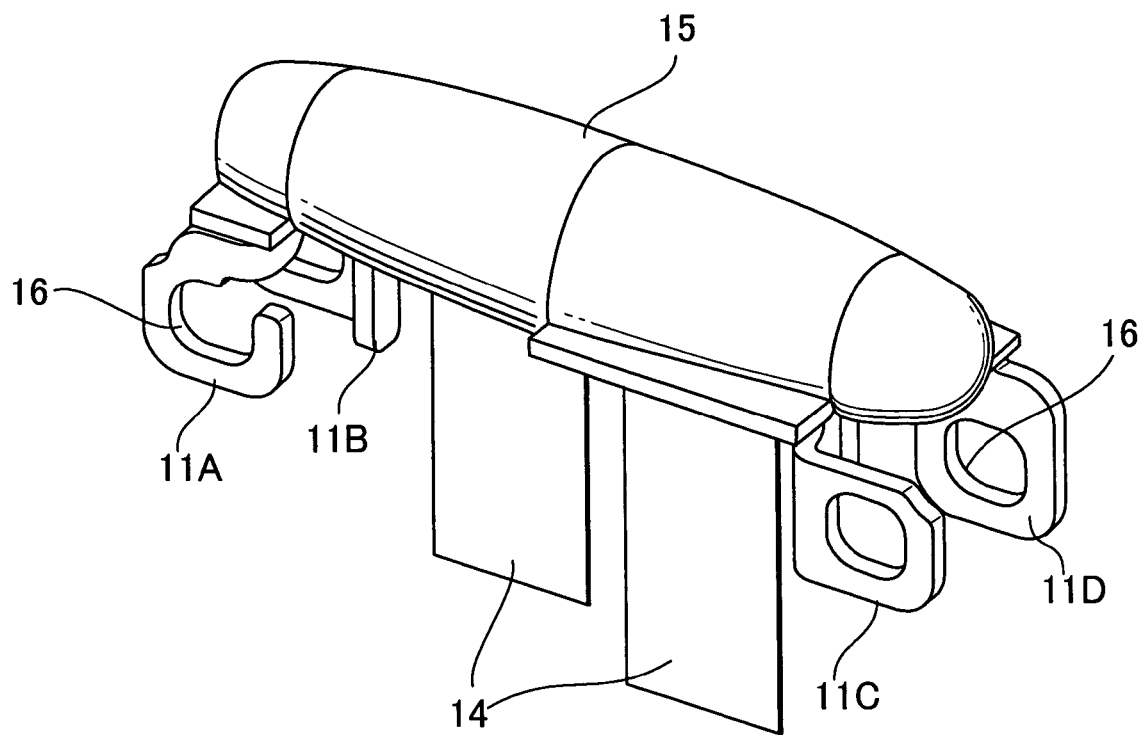
FIG. 9 is a view explaining the process of assembling the main body and display to the hinge device.

The shaft 20, penetrating axially of the hinge device 18, is provided over nearly the entire width thereof. The shaft 20 has a length to determine a width of the hinge device 18 and a width of a cellular phone using the hinge device 18 of the invention as well. More specifically, the hinge device 18 of the invention can be provided between the display 12 and the main body 13, i.e. over the entire width of the cellular phone, to provide the cellular phone with a width nearly equal to the width of the hinge device 18. Incidentally, the shaft 20 has an end 21 roll-worked or so in order to prevent the hinge arm, etc. from falling out of the shaft 20. Of course, it may be provided with a member, such as a stopper, separate from the shaft 20, as was shown in FIG. 7.

Each hinge arm 30A–30D has fixing portions 31A–31D (31C, 31D, though not shown, be considered similar to 31A, etc.) to be fixed to the display 12 and main body 13, and annular portions 33A–33D (33C, 33D, though not shown, be considered similar to 31A, etc.) to be inserted over the shaft 20. Particularly, the fixing portions 31A, 31C and the annular portions 33A, 33C are connected together in a state twisted 90 degree through bend portions 35A, 35C (35C, though not shown, be considered similar to 35A, etc.). Here, the fixing portions 31A, 31C of the hinge arms 30A, 30C is to be fixed to the display 12 (see FIG. 7) of the cellular phone by inserting a screw (not shown) in the center thereof. The fixing portions 31B, 31D of the hinge arms 30B, 30D is to be fixed to the main body 13 (see FIG. 7) of the same by the similar way. Meanwhile, the annular portions 33A, 33C of the hinge arms 30A, 30C is to be fixed to one end of the shaft 20 in a state the shaft 20 is inserted through a hole thereof (not shown). The annular portions 33B, 33D of the hinge arms 30B, 30D is provided in a state the shaft 20 is inserted through a hole thereof (not shown) and in a state the shaft 20 within the hole is allowed to rotate freely. Incidentally, the fixing portions 31A–31D is determined in its form with a mere consideration of being screwed to the cellular phone, which form is to be determined depending upon the subject of hinge connection hence being not limited to the shown form.

Here, notice should be paid to the annular portion 33B of the hinge arm 30B, particularly to its edge form. The annular portion 33B has a circumferential edge made in a somewhat complicated form, together with the stopper plate 60 and cam 50 especially provided for the invention. Firstly, the annular portion 33B has two comparatively large recesses 36A, 36B in the opposite edge positions sandwiching the axis. As clear from FIG. 2, in these recesses 36A, 36B are to be fit keys 51A, 51B (favorably shown in FIG. 4, referred later) of the cam 50 after assembled the hinge device 18 is assembled to the display 12 and main body 13. Meanwhile, in a part of the annular portion 33B edge, a circumferential recess 37 is provided which is not so deep as the recesses 36A, 36B but somewhat recessed relative to its surrounding region. Incidentally, the circumferential recess 37 and the comparatively large recess, particularly the recess 36A, are formed continuous. Because the recess 36A is in a position intermediate of the circumferential recess 37, the circumferential recess 37 can be considered separated by the comparatively large recess 36A into a first circumferential recess 37A having a comparatively short circumferential segment and a second circumferential recess 37B having a comparatively long circumferential segment. As clear from the figure, the comparatively large recesses 36A, 36B has a circumferential length 38 shorter than that of the circumferential recess 37. However, the recess has a depth 34 greater than that of the circumferential recess 37. The circumferential recess 37 has one part covered by (a circumferential protrusion 61 of) a stopper plate 60. Particularly, in the state of FIG. 2, i.e. in the state after completing the assembling of the hinge 18 to display 12 and main body 13, it should be noted that the circumferential protrusion 61 of the stopper plate 60 is in a position close to the second circumferential recess 37B instead of the first circumferential recess 37A. This point is important in relation to the state of assembling the hinge device 18 to the display 12 and main body 13 (favorably shown in FIG. 3). This will be referred later.

The cam 50 is arranged close to one end of the shaft 20 in a manner clamping the stopper plate 60 between the same and the annular portion 33B of the hinge arm 30B, in a state the shaft 20 penetrates through a hole provided axially thereof and in a state the shaft 20 is allowed to rotate freely within the hole. The cam 50 has a diameter nearly equal to the diameter of the annular portion 33B of hinge arm 30B. The cam 50 is provided with two keys 51A, 51B in its surface opposed to the annular portion 33B of hinge arm 30B. The keys 51A, 51B are provided in opposite positions to each other sandwiching the axis in a state protruding from around the circumferential edge of cam 50. Meanwhile, the cam 50 is provided with two recesses 53, 55 in a surface opposed to the cam follower 70. The recesses 53, 55 are provided at around the axis thereof. Those are to engage with predetermined portions (protrusions 71, 73) of the cam follower 70 and used to hold the rotational angle of the cam follower 70 relative to the cam 50 at a predetermined angle, e.g. 154 degrees herein.

The stopper plate 60 is arranged between the annular portion 33B of hinge arm 30B and the cam 50 such that the shaft 20 penetrates through a hole provided axially thereof and such that the shaft 20 is allowed to rotate freely within the hole. The stopper plate 60 temporarily prevents the key 51 of cam 50 from fitting in the comparatively large recess of annular portion 33B of hinge arm 30B (this state being shown in FIGS. 3 and 4, referred later) during assembling of the hinge device 18 to the display 12 and main body 13, allowing setting of the angle between the hinge arms 30A, 30C and the hinge arms 30B, 30D at a free angle of around 180 degrees. More specifically, the stopper plate 60 is arranged to be slidable (to rotate) over the annular portion 33B of hinge arm 30B, wherein particularly the circumferential protrusion 61 is over the first circumferential recess 37A and second circumferential recess 37 of annular portion 33B. When assembling the hinge device 18 to the display 12 and main body 13, the second circumferential recess 37 in its entirety is covered around the circumferential protrusions 61 to thereby temporarily prevent the key 51 of cam 50 from fitting in the recess 36 of annular portion 33B of hinge arm 30B. Incidentally, sliding of the stopper plate 60 over the annular portion 33B occurs only once in the direction of arrow A, i.e. only when putting the hinge device 18 into its normal use state after being assembled to the display 12 and main body 13. Meanwhile, rotating the stopper plate 60 depends upon an action of (the key 51) cam 50, which is described later. Incidentally, the circumferential protrusion 61 of stopper plate 60 is set with a length 63 greater than a circumferential length 38 of the recess 36 of cam 50. This prevents the stopper plate 60 itself from fitting in the recess 36.

The cam follower 70 is provided in a state the shaft 20 penetrates through the hole provided in the center thereof so that it can rotate about the shaft 20 due to rotation of the shaft 20 and can axially slide over the shaft 20. The cam follower 70 has two protrusions 71, 73 correspondingly to the two recesses 53, 55 of cam 50, on a rotation surface opposed to the fixing surface of cam 50. These protrusions 71, 73 are fit with the recesses 53, 55 of cam 50 at a predetermined force due to the action of the spring 90. When the cam follower 70 (shaft 20) is rotated against the force of spring 90, the protrusion 71, 73 of cam follower 70 disengages from one of the recesses 55, 53 of cam 50 and gets over its crests 56, 57 into a fitting with the other recesses 53, 55. The action of getting over the crests 56, 57 corresponds to opening/closing of the hinge arms 30A, 30C and hinge arms 30B, 30D (opening/closing of the display and main body).

The spring 90 is provided to expand/contract between the cam follower 70 and the spacer 80, in a state the shaft 20 penetrates through the interior thereof and in a state the shaft 20 is allowed to rotate freely at the inside thereof. As described above, the spring 90 always biases the cam follower 70 toward the cam 50. Particularly, when the protrusions 71, 73 of cam follower 70 fit in the recesses 53, 55 of cam 50, it has an important role to hold the state. As is clear, the biasing force of spring 90 serves to hold, at a certain force, the angle of hinge arms to define during assembling the hinge device 18 to the display 12 and main body 13. Furthermore, when the stopper plate 60 is rotated by the cam 50, in other words, when the cam 50 is not yet fixed to the hinge arm 30B, the biasing force of spring 90 also has an important role in rotating the cam 50 by means of the cam follower 70 and hinge arm 30A, 30C.

The spacer 80 is arranged between the spring 90 and the hinge arm 30C, in a state the shaft 20 penetrates through the interior thereof, preferably in a state the shaft 20 is allowed to rotate freely at the inside thereof. By adjusting the distance between the cam follower 70 and the spring 90 through properly adjusting the length of spacer 80, the biasing force can be adjusted of the cam follower 70 toward the cam 50. Incidentally, in order not to give an excessive force of spacer 80 to the hinge arm 30C, a pin (not shown) may be provided in a manner partitioning between the spring 90 and the hinge arm 30C. The pin may radially extend orthogonal to the shaft 20 from the shaft 20, and have a length nearly equal to the radius of the spacer 80, for example.

Figure 3:
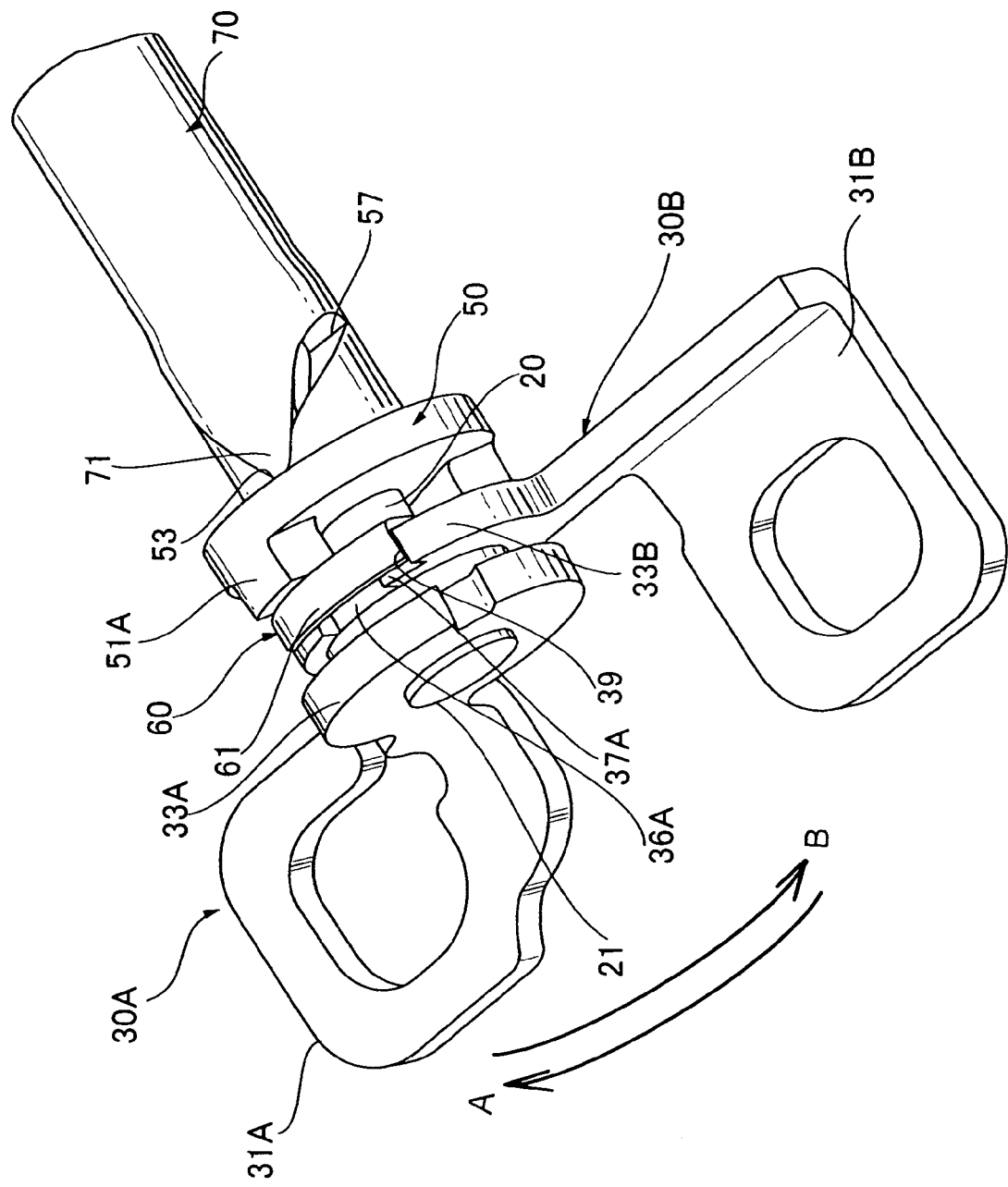
FIG. 3 is a view explaining a mechanism for temporarily setting/holding an angle between hinge arms by means of a stopper plate.
Figure 4:
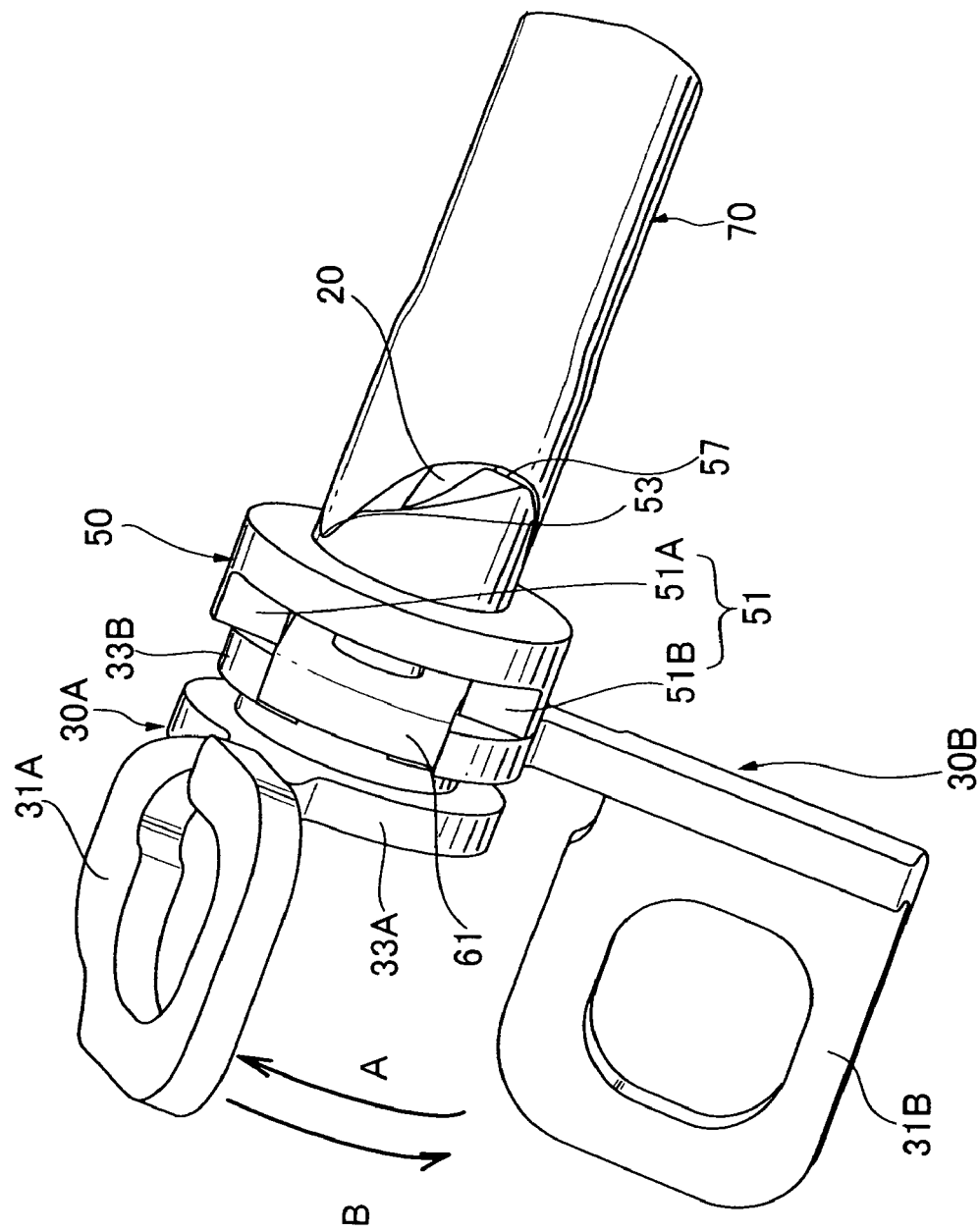
FIG. 4 is a view explaining the mechanism for temporarily setting/holding an angle between hinge arms by means of the stopper plate.
Figure 5:
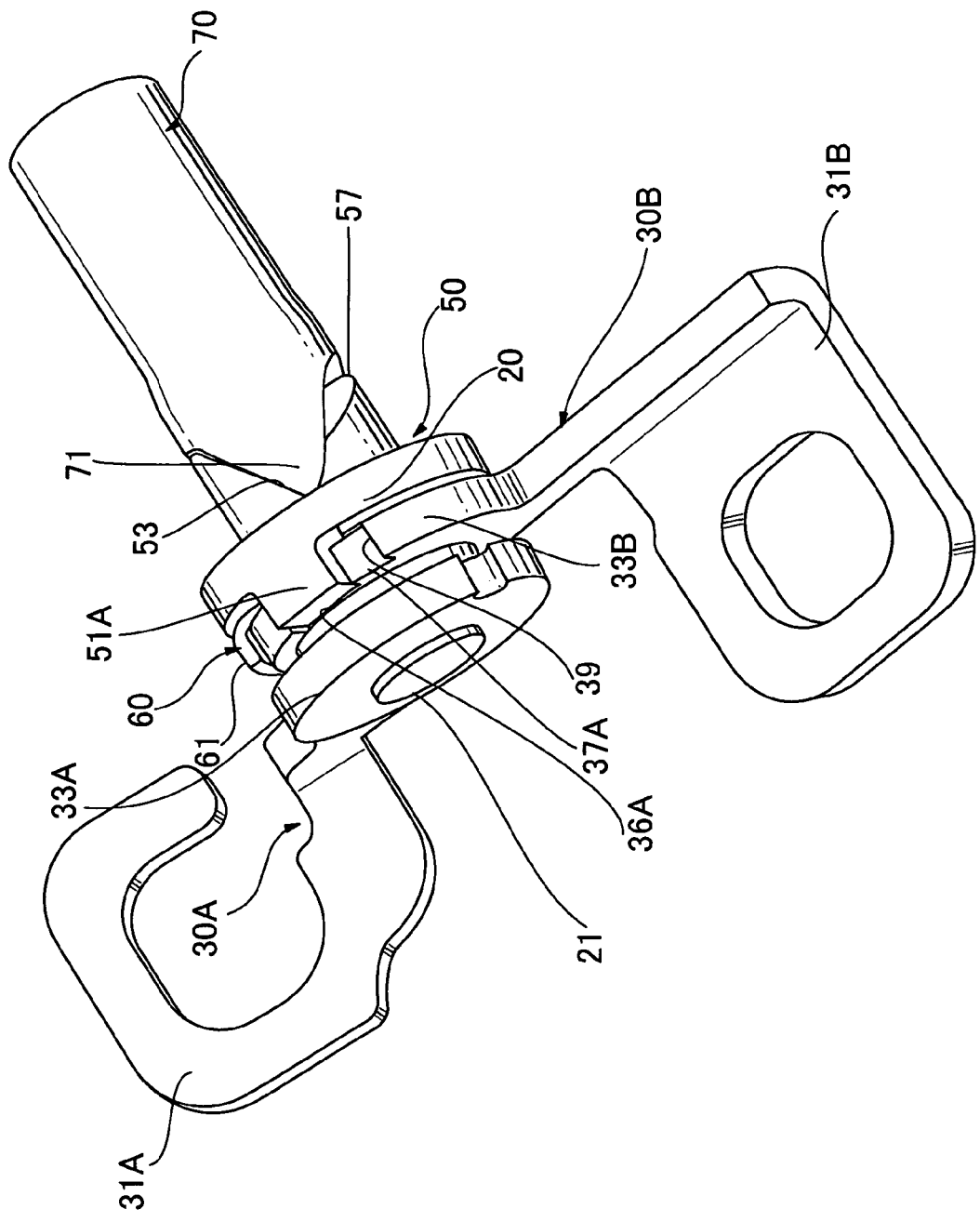
FIG. 5 is a view explaining the mechanism for temporarily setting/holding an angle between hinge arms by means of the stopper plate.

Finally, referring FIGS. 3 to 5, explanation is made on a mechanism for temporarily setting/holding the angle between the hinge arms by means of the stopper plate 60. FIG. 3 shows a state that the angle between the hinge arms can be freely set during assembling the hinge device to the display and main body, in other words, a state the cam key is temporarily prevented by the stopper plate from fitting in the comparatively large recess in the hinge arm annular portion. FIG. 4 is a state the stopper plate is rotated on the annular portion of hinge arm by the action of cam keys. FIG. 5 is a figure, corresponding also to FIG. 2, showing a state after assembled the hinge device to the display and main body, in other words, a state after the stopper plate is slid and the cam key completely fits in the recess of annular portion.

Fixing of the hinge arm 30 to the display 12 and main body 13 is done in a state that the angle between hinge arms 30A, 30C and hinge arms 30B, 30D is set/held at around 180 degrees, as shown in FIG. 3. As shown in the figure, when the stopper plate 60 is in a state operative effectively, i.e. colliding with the wall 39 defining particularly the first circumferential recess 37A of annular portion 33B and the comparatively large recess 36A (recess positioned between the first circumferential recess 37A and the second circumferential recess 37B) of annular portion 33B is completely covered by the circumferential protrusion 61 of stopper plate 60, the key 51 of cam 50 permanently does not fit in the recess 36 of annular section 33B. Accordingly, in this case, the angle between hinge arms 30A, 30C and hinge arms 30B, 30D can be temporarily set at a desired angle, e.g. at around 180 degrees. Incidentally, at this time, the key 51 of key 50 abuts against the stopper plate 60 and urged thereon at a certain force due to the action of spring 90. Accordingly, the angle can be considered being held at a certain force.

After fixing the hinge arm 30 to the display 12 and main body 13, the hinge device 18 is rendered in the usual use state. First, there is a need to remove the stopper plate 60 out of the annular portion 33B. For this reason, the hinge arms 30A, 30C is rotated in the direction of the arrow B shown in FIG. 3. Rotation of the hinge arms 30A, 30C causes a rotation of the shaft 20, the cam follower 70 and further the cam 50 engaged with the cam follower 70 by a force of spring 90. Meanwhile, the key 51 of cam 50 while abutting against the stopper plate 60 slides directly over there. When the stopper plate 60 just becomes nonexistent in between the key 51 of cam 51 and the annular portion 30B, the key 51 of cam 50 and the stopper plate 60 are released from engagement, as shown in FIG. 4. Instead, the key 51 of cam 50 snaps to hit the annular portion 33B surface by the action of spring 90. After rendered in the state of FIG. 4, the hinge arms 30A, 30C this time is rotated in the direction of A reverse to the direction B. At this time, as favorably shown in FIG. 4, because the stopper plate 60 is in a position between the keys 51 of cam 50, the stopper plate 60 slides over the annular portion 33B due to rotation of the hinge arms 30A, 30C. As a result, the stopper plate 60 is removed from the recess 36 of annular portion 33B. Thereafter, when the key 51 of cam 50 reaches the recess 36 of annular portion 33B, the key 51 fits in the recess 36 due to a force of the spring 90, thus providing the usual use state as shown in FIG. 5. As is clear, in the usual use state, the stopper plate 60 does not prevent the action of the hinge device 18.

Incidentally, although the hinge device of the invention was explained by exemplifying the cellular phone, the hinge device is not limited to the cellular phone but can naturally be applied to various electronic appliances.

According to the invention, at least when assembling the hinge device to the display and main body, the angle between the hinge arms can be set/held to a proper angle, e.g. at around 180 degrees. After completing such assembling, it is possible to provide a hinge device that the usual use state is not prevented by an angle setting.

What is claimed is:

1. A hinge device having angle set function, comprising:
   a shaft;
   a fixed part provided adjacent to one end of the shaft and not to rotate with rotation of the shaft;
   a first cam member having an engaging portion for engagement with a part of the fixed part, in a surface opposed to the fixed part, and an angle hold portion in an surface opposite thereto;

a second cam member provided for rotating about the shaft and for sliding over the shaft, and having an angle hold portion for holding, at a predetermined angle, an own rotation angle relative to the first cam member cooperatively with the angle hold portion of the first cam member;

an elastic member for always biasing the second cam member toward the first cam member;

a prevention member arranged between the fixed part and the first cam member and for preventing against engagement between the part of the fixed part and the engaging portion of the first cam member;

a first arm for rotating with rotation of the shaft; and a second arm not for rotating with rotation of the shaft;

whereby the first cam member is to rotate with rotation of the shaft when the prevention member prevents against an engagement between the part of the fixed part and the engaging portion of the first cam member, the first cam member being arranged not to rotate with rotation of the shaft when engagement is made between the part of the fixed part and the engaging portion of the first cam member.

2. A hinge device according to claim 1, wherein the fixed part is a part of the second arm.

3. A hinge device according to claim 1, wherein, when the prevention member prevents an engagement between the one part of the fixed part and the engaging portion of the first cam member, the first arm and the second arm are to be set at an angle defined substantially of 180 degrees.

4. A folding cellular phone formed by fixing a main body to the first arm of and a display to the second arm of the hinge device according to claim 1.

5. A hinge device having angle set function, comprising:

a shaft;

an annular portion provided adjacent to one end of the shaft and having a first recess in an own circumferential edge and a second recess deeper and shorter than the first recess, thus not being allowed to rotate with rotation of the shaft;

a fixed cam provided at least for temporarily rotating about the shaft and having a protrusion, for fitting in the second recess of the annular portion, in a surface opposed to the annular portion, and an angle hold portion in a surface opposite thereto;

a movable cam provided for rotating about the shaft with and for sliding over the shaft, and having an angle hold portion for engagement with the angle hold portion of the fixed cam and holding, at a predetermined angle, an own rotation angle to the fixed cam;

a spacer provided adjacent to the other end of the shaft;

a spring provided between the spacer and the movable cam and always biasing the movable cam toward the fixed cam;

a stopper member arranged between the annular portion and the fixed cam and for sliding over between the first recess and the second recess, and for covering over the second recess and temporarily preventing the cam protrusion from fitting in the second recess;

a first arm for rotating with rotation of the shaft; and a second arm not for rotating with rotation of the shaft;

whereby the fixed cam is to rotate with rotation of the shaft through engagement with the movable cam in a state the protrusion of the fixed cam and the stopper member is kept in abutment when the stopper member temporarily prevents the protrusion of the fixed cam from fitting in the second recess, the fixed cam being unable to rotate with rotation of the shaft due to a fitting between the protrusion of the fixed cam and the second recess of the annular portion when the stopper member is slid to not cover the second recess.

6. A hinge device according to claim 5, wherein, when the stopper member temporarily prevents the protrusion of the cam from fitting in the second recess, the fixed cam is rotated a predetermined angle in a predetermined direction thereby releasing the abutment of the protrusion of the fixed cam and the stopper member into an abutment against the annular portion instead thereof, and subsequently the fixed cam is rotated in an opposite direction whereby the stopper member is allowed to slide by utilization of the protrusion of the fixed cam.

7. A hinge device according to claim 5, wherein, when the stopper member covers the second recess, the first arm and the second arm are to be set at an angle defined substantially of 180 degrees.

8. A folding cellular phone formed by fixing a main body to the first arm of and a display to the second arm of a hinge device according to claim 5.

* * * * *